(12) United States Patent
Kang et al.

(10) Patent No.: US 9,130,508 B1
(45) Date of Patent: Sep. 8, 2015

(54) SHUNT RESISTOR AND CAPACITOR TERMINATION FOR BROADBAND RESISTIVE MIXER

(71) Applicant: HRL LABORATORIES, LLC, Malibu, CA (US)

(72) Inventors: Jongchan Kang, Moorpark, CA (US); Ara K. Kurdoghlian, La Canada, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 13/930,935

(22) Filed: Jun. 28, 2013

(51) Int. Cl.
   *G06F 7/44* (2006.01)
   *H03D 7/14* (2006.01)

(52) U.S. Cl.
   CPC .................................. *H03D 7/1483* (2013.01)

(58) Field of Classification Search
   USPC ........... 327/355, 356, 361; 455/313, 316–320
   See application file for complete search history.

(56) References Cited

U.S. PATENT DOCUMENTS

| | | | | |
|---|---|---|---|---|
| 5,263,198 | A * | 11/1993 | Geddes et al. | 455/325 |
| 6,046,668 | A * | 4/2000 | Forster | 340/10.4 |
| 6,861,891 | B2 * | 3/2005 | Romano | 327/355 |
| 2002/0163375 | A1* | 11/2002 | Wu et al. | 327/356 |
| 2010/0081408 | A1* | 4/2010 | Mu et al. | 455/326 |

OTHER PUBLICATIONS

Amin Q. Safarian, Ahmad Yazdi and Payam Heydari in "Design and Analysis of an Ultrawide-Band Distributed CMOS Mixer" IEEE Transactions on Very Large Scale Integration Systems, vol. 13, No. 5, May 2005.

* cited by examiner

*Primary Examiner* — Lincoln Donovan
*Assistant Examiner* — Thomas Skibinski
(74) *Attorney, Agent, or Firm* — Ladas & Parry

(57) ABSTRACT

A mixer including a field effect transistor having a source, a drain and a gate, an input port coupled to the source or to the drain of the field effect transistor, an output port coupled to the drain of the field effect transistor if the input port is coupled to the source, or coupled to the source of the field effect transistor if the input port is coupled to the drain, a local oscillator for mixing a first frequency on the input port to a second frequency on the output port, a first micro-strip line coupling the local oscillator to the gate, and a shunt resistor capacitor termination coupled to the gate. The shunt resistor capacitor termination includes a resistor in series with a capacitor.

22 Claims, 6 Drawing Sheets

SHUNT RESISTOR AND CAPACITOR TERMINATION FOR BROADBAND RESISTIVE MIXER

STATEMENT REGARDING FEDERAL FUNDING

This invention was made under U.S. Government contract No. N00014-11-C-0130. The U.S. Government has certain rights in this invention.

CROSS REFERENCE TO RELATED APPLICATIONS

None

TECHNICAL FIELD

This disclosure relates to broadband mixers.

BACKGROUND

In the prior art, broadband resistive microwave mixers using field effect transistors (FETs) or bipolar junction transistors (BJTs) have frequency bandwidths that are limited by in-band self-resonance on the gate or base side, respectively. This self-resonance typically happens due to the resonance of a capacitance of a gate or base and an inductance of a micro-strip routing line.

Conversion loss for a mixer is defined as the ratio of the power at the output frequency to the power at the input frequency with a given local oscillator (LO) power. In the prior art, because of the self-resonance, the conversion loss is worse at the resonance frequency. Further the handling power of a mixer proportionally decreases with the frequency bandwidth, because one way to reduce the capacitance of the gate or base to increase frequency bandwidth is to reduce the size of the FET or BJT, which reduces the power handling capability.

In the prior art distributed mixers are another approach to achieve a broadband mixer. Distributed mixers use multiple small cells along with multiple sections of transmission line and terminate the local oscillator (LO) and radio frequency (RF) nodes with approximately 50 Ohm resistors. However, these distributed mixers are very complex and need a large space to interconnect the active devices in each stage active by using long micro-strip transmission lines. Besides the waste of large space and complexity, these long micro-strip transmission lines are another source of ohmic loss. Another disadvantage of the distributed mixer approach is that the RF node termination resistors dissipate RF power and increase conversion loss.

Such a distributed mixer, as shown in FIG. 1, is described by Amin Q. Safarian, Ahmad Yazdi and Payam Heydari in "Design and Analysis of an Ultrawide-Band Distributed CMOS Mixer" IEEE Transactions on Very Large Scale Integration Systems, Vol. 13, No. 5, May 2005. The inductors shown in FIG. 1 correspond to micro-strip routing lines.

What is needed is a broadband mixer that has low conversion loss over a broadband frequency. Also needed is a broadband mixer with high power handling capability. The embodiments of the present disclosure answer these and other needs.

SUMMARY

In a first embodiment disclosed herein, a mixer comprises a field effect transistor having a source, a drain and a gate, an input port coupled to the source or to the drain of the field effect transistor, an output port coupled to the drain of the field effect transistor if the input port is coupled to the source, or coupled to the source of the field effect transistor if the input port is coupled to the drain, a local oscillator for mixing a first frequency on the input port to a second frequency on the output port, a first micro-strip line coupling the local oscillator to the gate; and a shunt resistor capacitor termination coupled to the gate, wherein the shunt resistor capacitor termination comprises a resistor in series with a capacitor.

In another embodiment disclosed herein, a double balanced mixer comprises first, second, third and fourth field effect transistors, each having a source, a drain and a gate, an input port coupled to the source or to the drain of each field effect transistor, an output port coupled to the drain of each field effect transistor if the input port is coupled to the sources of the field effect transistors, or coupled to the sources of each field effect transistor if the input port is coupled to the drains of the field effect transistors, a local oscillator for mixing a first frequency on the input port to a second frequency on the output port, a first micro-strip line coupling the local oscillator to the gate of the first field effect transistor, a second micro-strip line coupling the local oscillator to the gate of the second field effect transistor, a third micro-strip line coupling the gate of the first field effect transistor to the gate of the fourth field effect transistor, a fourth micro-strip line coupling the gate of the third field effect transistor to the gate of the second field effect transistor, and first, second, third and fourth shunt resistor capacitor terminations coupled, respectively, to the gates of the first, second, third and fourth field effect transistor, wherein each shunt resistor capacitor termination comprises a resistor in series with a capacitor.

In yet another embodiment disclosed herein, a mixer comprises a bipolar junction transistor having an emitter, a collector, and a base, an input port coupled to the emitter or to the collector of the bipolar junction transistor, an output port coupled to the collector of the bipolar junction transistor if the input port is coupled to the emitter, or coupled to the emitter of the bipolar junction transistor if the input port is coupled to the collector, a local oscillator for mixing a first frequency on the input port to a second frequency on the output port, a first micro-strip line coupling the local oscillator to the base, and a shunt resistor capacitor termination coupled to the base, wherein the shunt resistor capacitor termination comprises a resistor in series with a capacitor.

In another embodiment disclosed herein, a double balanced mixer comprises first, second, third and fourth bipolar junction transistors, each having a emitter, a collector and a base, an input port coupled to the emitter or to the collector of each bipolar junction transistor, an output port coupled to the collector of each bipolar junction transistor if the input port is coupled to the emitters of the bipolar junction transistors, or coupled to the emitters of each bipolar junction transistor if the input port is coupled to the collectors of the bipolar junction transistors, a local oscillator for mixing a first frequency on the input port to a second frequency on the output port, a first micro-strip line coupling the local oscillator to the base of the first bipolar junction transistor, a second micro-strip line coupling the local oscillator to the base of the second bipolar junction transistor, a third micro-strip line coupling the base of the first bipolar junction transistor to the base of the fourth bipolar junction transistor, a fourth micro-strip line coupling the base of the third bipolar junction transistor to the base of the second bipolar junction transistor, and first, second, third and fourth shunt resistor capacitor terminations coupled, respectively, to the bases of the first, second, third and fourth bipolar junction transistor, wherein each shunt resistor capacitor termination comprises a resistor in series with a capacitor.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figure 1:
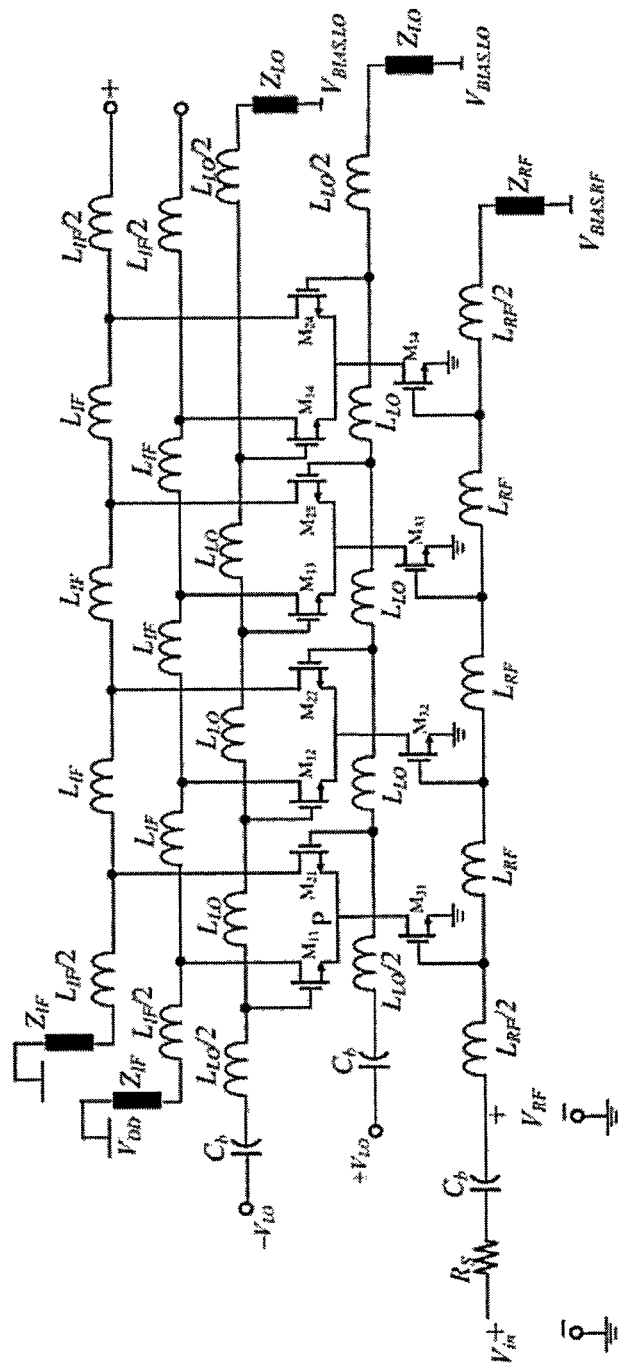
FIG. 1 shows a distributed mixer in accordance with the prior art.
Figure 2:
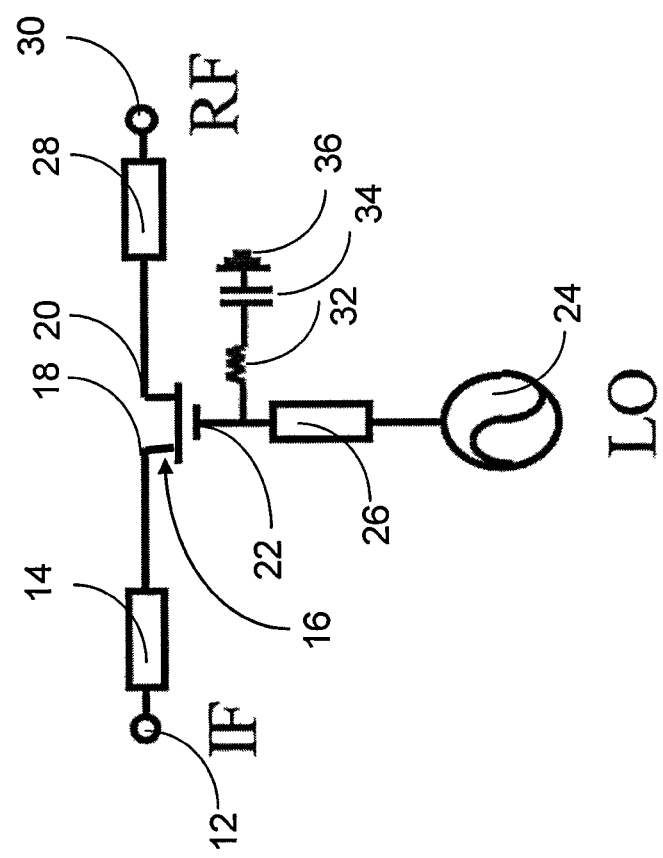
FIG. 2 shows a circuit diagram for a mixer in accordance with the present disclosure.

FIG. 2 shows a circuit diagram for a mixer in accordance with the present disclosure. An intermediate frequency (IF) input 12 is connected via a micro-strip line 14 to the source 18 of field effect transistor (FET) 16. The drain 20 is connected via micro-strip line 28 to radio frequency (RF) output 30. The IF is mixed to RF by local oscillator (LO) 24, which is connected via micro-strip 26 to gate 22 on FET 16. The connection to gate 22 is terminated with a shunt resistor capacitor (RC) with resistor 32 and capacitor 34 in series to ground 36.

By terminating the gate 22, which may be highly capacitive with the shunt resistor 32 and dc-blocking capacitor 34, the self-resonance frequency can be shifted to a lower out of band frequency, which results in a broader band frequency mixer. The capacitor 34 blocks any direct current (DC) leakage. Furthermore, the capacitance of the gate 22 may be higher, so the device size can be freely enlarged in order to provide higher microwave power. This high power microwave component is very important for some applications, including a jamming free receiver design.

In the circuit shown in FIG. 2, a person skilled in the art would readily understand that the source 18 and drain 20 can be reversed, so that the IF is connected to the drain 20 and the RF connected to the source 18.

The FET 16 may also be a bipolar junction transistor (BJT) with an emitter in place of the source 18 and the IF connected via a micro-strip line to the emitter, a collector in place of the drain 20 and the collector connected via a micro-strip line to the RF, and a base in place of the gate 22 and the base connected via a micro-strip line to the LO. The connection to the base of the BJT in this embodiment is terminated with a shunt resistor capacitor (RC) with resistor 32 and capacitor 34 in series to ground 36. A person skilled in the art would readily understand that the emitter and collector can be reversed, so that the IF is connected to the collector and the RF connected to the emitter.

The mixer with a gate or base with a shunt RC termination, as described above, can have a single balanced, double balanced or triple balanced resistive mixer architecture. In some of these embodiments, multiple active devices (FETs or BJTs) are used. In those embodiments each active device having a gate or base coupled to the local oscillator has a shunt RC termination on the gate or base.

Figure 3:
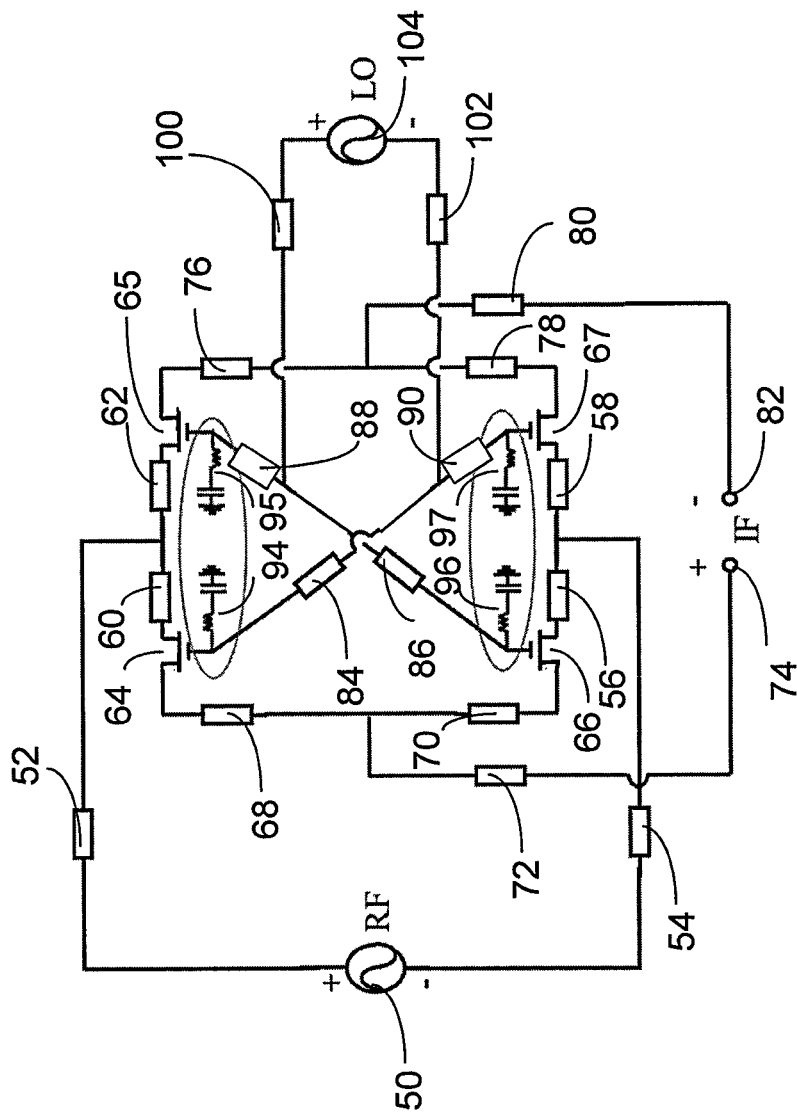
FIG. 3 shows a circuit diagram for a double balanced mixer in accordance with the present disclosure.

FIG. 3 shows a circuit diagram for a double balanced mixer in accordance with the present disclosure. Since it is double balanced configuration, the RF, LO and IF ports each have a balanced input and output. The positive polarity of the RF port 50 is connected to the sources of FETs 64 and 65 via micro-strip lines 52, 6Q and 62. The negative polarity of the RF port 50 is connected to the sources of FETs 66 and 67 via micro-strip lines 54, 56 and 58. The positive polarity of the IF port 74 is connected to the drains of FETs 64 and 66 via micro-strip lines 72, 68 and 70. The negative polarity of the IF port 82 is connected to the drains of FETs 65 and 67 via micro-strip lines 80, 76 and 78. The positive polarity of LO port 104 is connected to the gate of FETs 65 and 66 via micro-strip lines 100, 86, and 88. The negative polarity of LQ port 104 is connected to the gate of FETs 64 and 67 via micro-strip lines 102, 84, and 90.

Each gate of FETs 64, 65, 66 and 67 has a RC shunt termination 94, 95, 96 and 97, respectively. Each RC shunt termination 94, 95, 96 and 97 has a resistor and capacitor in series to ground.

In the circuit shown in FIG. 3, a person skilled in the art would readily understand that the sources and drains of the FETs can be reversed, so that the RF port 50 is connected to the drains and the IF port 74,82 is connected to the sources of the FETs 64, 65, 66 and 67.

As described above with respect to FIG. 2, the FETs 64, 65, 66 and 67 may instead be bipolar junction transistors (BJTs) with emitter in place of the sources, collectors in place of the drains, and bases in place of the gates. A person skilled in the art would readily understand that the emitter and collector can be reversed, so that the RF is connected to the collector and the IF connected to the emitter.

Each of the active devices 64, 65, 66 and 67 may be non-distributed single cells with the size of 160 um gate width and biased under the device threshold level. The RC shunt terminations 94, 95, 96 and 97 are optimized by selection of resistor and capacitor values to achieve a broadband mixer.

Figure 4:
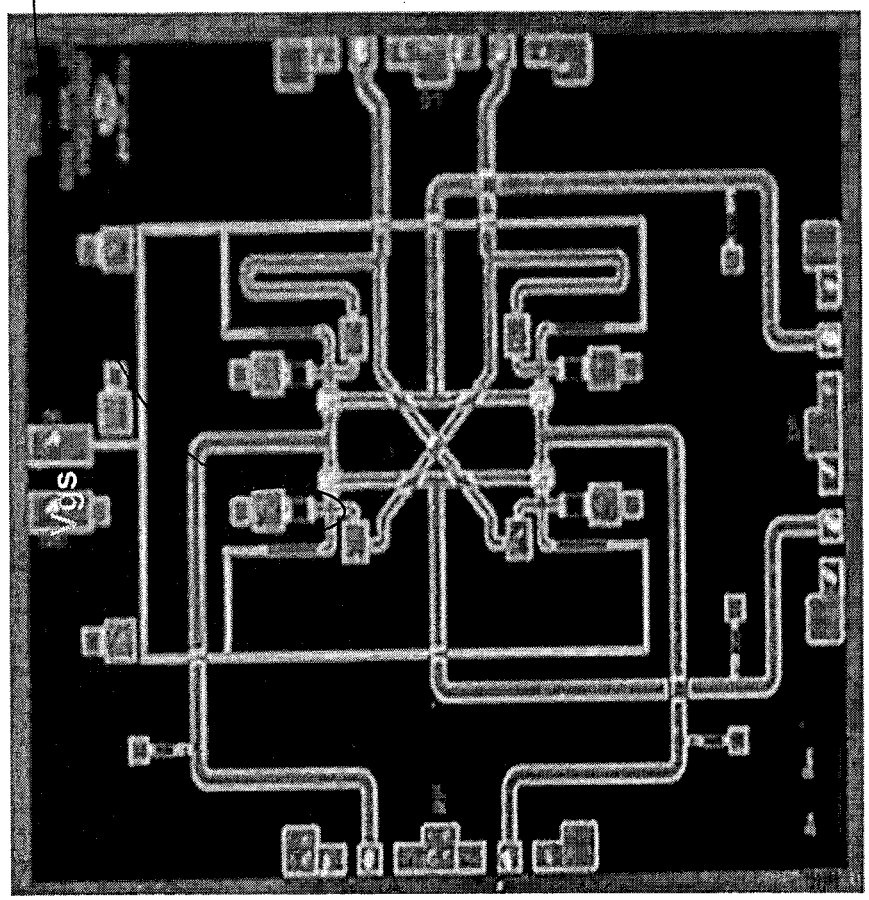
FIG. 4 shows an implementation of the circuit of FIG. 3 in accordance with the present disclosure.

FIG. 4 shows a MMIC level implementation of the circuit of FIG. 3. The RC shunt terminations, such as RC shunt termination 94, may have a 75 Ohm TaN resistor and 3 pF MIM capacitor in series to ground. All of the micro-strip transmission lines may be realized with Au metal. The implementation may be realized in a MMIC level or PCB level design.

Figure 5:
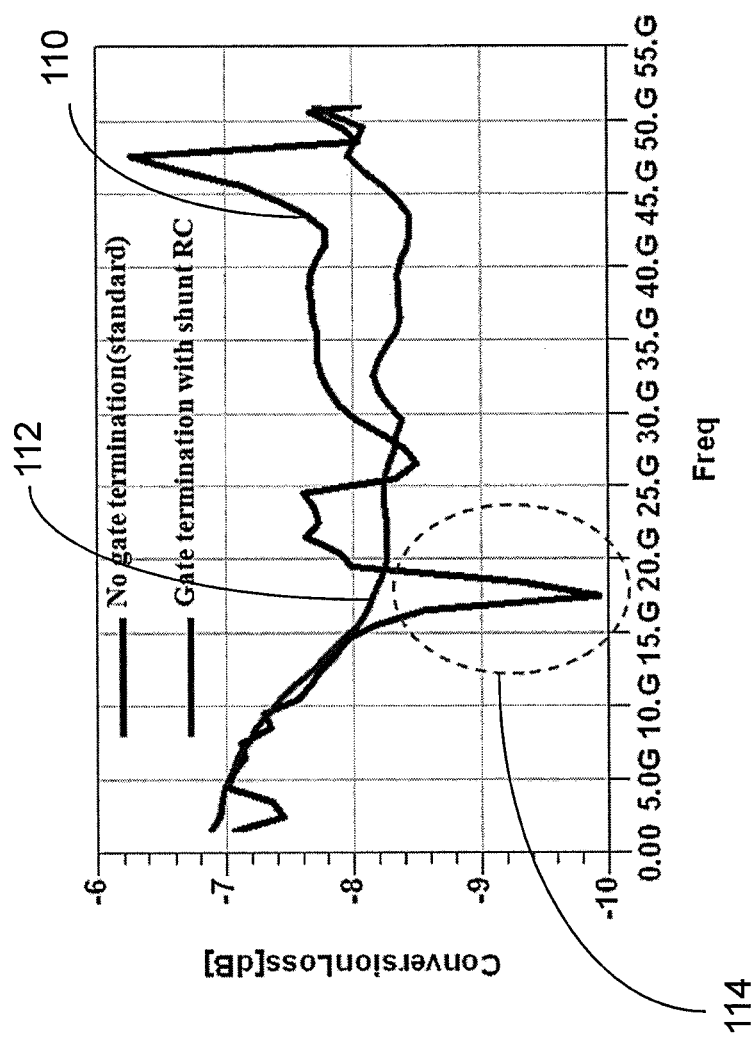
FIG. 5 shows a graph of conversions losses for prior art mixer and a mixer in accordance with the present disclosure.

Simulation has been performed for the circuit of FIG. 3 by using a microwave circuit simulator. FIG. 5 shows a graph of conversions losses for the double balanced mixer without RC shunt terminations and the double balanced mixer with RC shunt terminations in accordance with the present disclosure.

As shown in the FIG. 5 graph, a prior art mixer without shunt resistor termination 110 on the gate has a large conversion loss 114 around 17 GHz. This large conversion loss happens because of the gate side self-resonance of the gate capacitance and micro-strip line inductance. The mixer with shunt resistor termination 112 on the gates shows no large conversion loss up to 60 GHz and provides lower than 8.5 dB conversion loss from DC to 60 GHz. The simulation showed a P1dB RF power of 20 dBm.

According to a survey of the prior art mixers, the best broadband mixer product had a conversion loss of 9 dB from 0.5 GHz to 50 GHz with a 9 dBm P1dB RF input power. So, comparing the conversion loss and P1dB RF input power, the mixer with shunt resistor termination on the gates has a wider bandwidth, lower conversion loss, and a higher P1dB power, all of which are more desirable.

Figure 6:
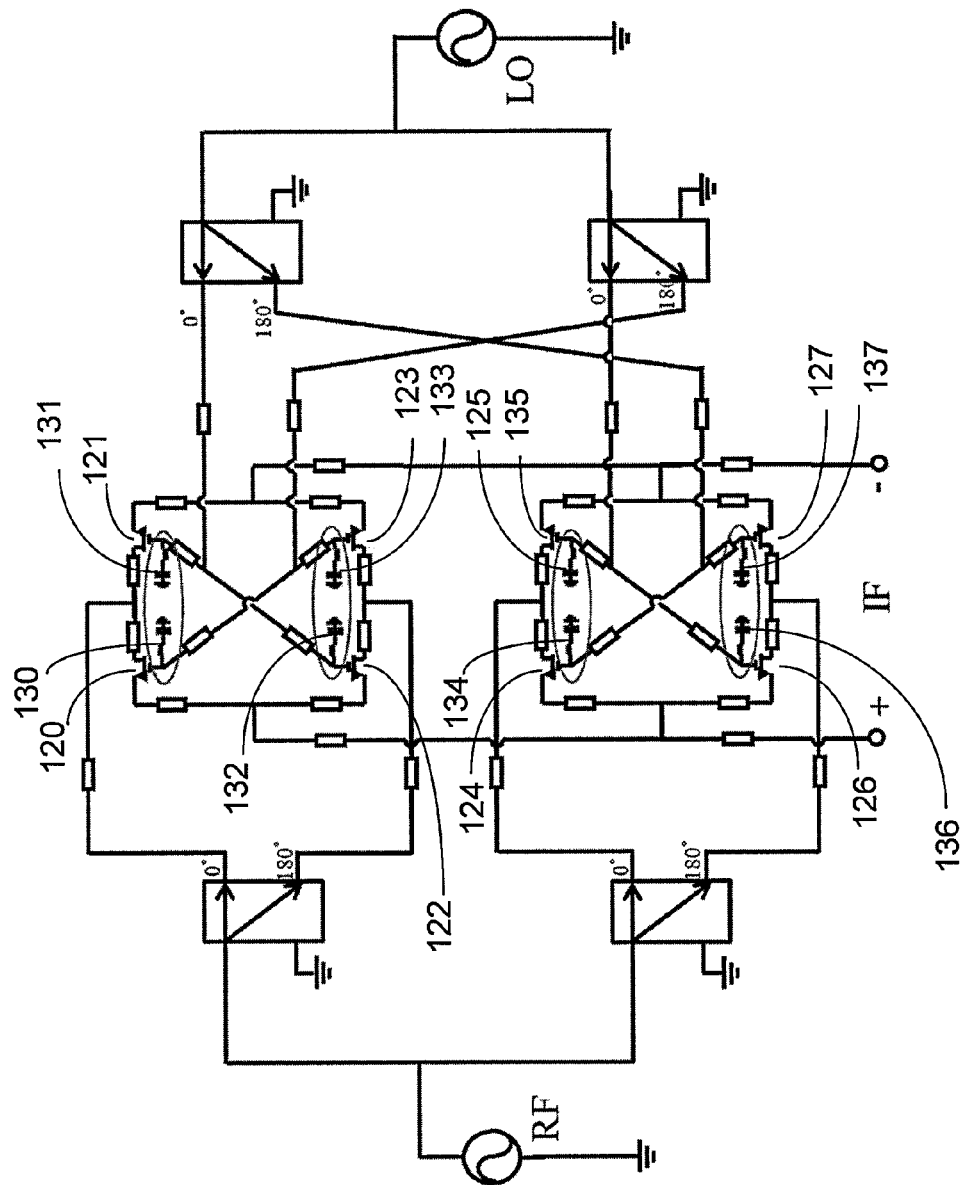
FIG. 6 shows a circuit diagram for a triple balanced resistive mixer also known as a doubly double balanced resistive mixer in accordance with the present disclosure.

FIG. 6 shows a circuit diagram for a triple balanced resistive mixer also known as a doubly double balanced resistive mixer in accordance with the present disclosure. As shown in FIG. 6, a triple balanced resistive mixer or doubly double balanced resistive mixer has eight active devices 120 to 127, which may be FETs or BJTs. Each active device 120 to 127 has a RC shunt termination 130-137, respectively. Each RC shunt termination 130-137 has a resistor and capacitor in series to ground.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . ." and no method or process step herein is to be construed under those provisions unless the step, or steps, are expressly recited using the phrase "comprising the step(s) of . . . ."

What is claimed is:

1. A mixer comprising:
   a field effect transistor having a source, a drain and a gate;
   an input port coupled to a first end of a first micro-strip line, wherein a second end of the first micro-strip line is connected to either the source or to the drain of the field effect transistor;
   an output port coupled to a first end of a second micro-strip line, wherein a second end of the second micro-strip line is connected to the drain of the field effect transistor if the input port is coupled to the source by the first micro-strip line, or connected to the source of the field effect transistor if the input port is coupled to the drain by the first micro-strip line;
   a shunt resistor capacitor termination connected to the gate;
   a third micro-strip line, the third micro-strip line having a first end and a second end;
   a local oscillator (LO) directly connected to the first end of the third micro-strip line; and
   the second end of the third micro-strip line connected to the gate and connected to the shunt resistor capacitor termination;
   wherein the LO has an LO frequency for mixing with a first frequency on the input port to produce a second frequency on the output port;
   wherein the shunt resistor capacitor termination comprises a resistor in series with a capacitor; and
   wherein the shunt resistor capacitor termination is configured to reduce conversion loss of the mixer due to a self-resonance of a capacitance of the gate and an inductance of the third micro-strip line.

2. The mixer of claim 1 wherein:
   the input port is a radio frequency port; and
   the output port is an intermediate frequency port.

3. The mixer of claim 1 wherein:
   the input port is an intermediate frequency port; and
   the output port is a radio frequency port.

4. The mixer of claim 1 wherein the shunt resistor capacitor termination comprises a resistor connected to the gate and connected to a first terminal of a capacitor, and wherein a second terminal of the capacitor is connected to a ground.

5. The mixer of claim 1 wherein the mixer comprises a single balanced, double balanced or triple balanced resistive mixer.

6. A double balanced mixer comprising:
   first, second, third and fourth field effect transistors, each having a source, a drain and a gate;
   an input port having a positive and a negative polarity, the positive polarity of the input port coupled to either the source of the first and second field effect transistors or to the drain of the first and second field effect transistors, and the negative polarity of the input port coupled to either the source of the third and fourth field effect transistors or to the drain of the third and fourth field effect transistors;
   an output port having a positive and a negative polarity, the positive polarity of the output port coupled to the drain of the first and third field effect transistors if the positive polarity of the input port is coupled to the source of the first field effect transistor and the negative polarity of the input port is coupled to the source of the third field effect transistor, or the positive polarity of the output port coupled to the source of the first and third field effect transistor if the positive polarity of the input port is coupled to the drain of the first field effect transistor and the negative polarity of the input port is coupled to the drain of the third field effect transistor, and the negative polarity of the output port coupled to the drain of the second and fourth field effect transistors if the positive polarity of the input port is coupled to the source of the second field effect transistor and the negative polarity of the input port is coupled to the source of the fourth field effect transistor, or the negative polarity of the output port is coupled to the source of the second and fourth field effect transistors if the positive polarity of the input port is coupled to the drain of the second field effect transistor and the negative polarity of the input port is coupled to the drain of the fourth field effect transistor;

a local oscillator for mixing a first frequency on the input port to a second frequency on the output port, the local oscillator having a positive and a negative polarity;

a first micro-strip line coupled to the gate of the first field effect transistor;

a second micro-strip line coupled to the gate of the fourth field effect transistor and coupled at a first junction to the first micro-strip line;

a third micro-strip line coupled to the gate of the second field effect transistor;

a fourth micro-strip line coupled to the gate of the third field effect transistor and coupled at a second junction to the third micro-strip line;

the positive polarity of the local oscillator connected to a first end of a fifth micro-strip line, a second end of the fifth micro-strip line connected to the second junction, and the negative polarity of the local oscillator connected to a first end of a sixth micro-strip line, a second end of the sixth micro-strip line connected to the first junction; and first, second, third and fourth shunt resistor capacitor terminations connected, respectively, to the gates of the first, second, third and fourth field effect transistor;

wherein each shunt resistor capacitor termination comprises a resistor in series with a capacitor; and wherein the shunt resistor capacitor termination shifts a self-resonance frequency of the gate to a lower out of band frequency to provide a broader band frequency mixer.

7. The mixer of claim 6 wherein each shunt resistor capacitor termination comprises a 75 ohm resistor in series with a 3 pF capacitor.

8. The mixer of claim 6 wherein:
the mixer has less than 8.5 dB conversion loss from 0 Hz to 60 GHz; and
the mixer has a P1dB of 20 dBm.

9. The mixer of claim 6 wherein each shunt resistor capacitor termination comprises a resistor connected to the respective gate and connected to a first terminal of a capacitor, and wherein a second terminal of the capacitor is connected to a ground.

10. The mixer of claim 6 wherein:
the input port is a radio frequency port; and
the output port is an intermediate frequency port.

11. The mixer of claim 6 wherein:
the input port is an intermediate frequency port; and
the output port is a radio frequency port.

12. The mixer of claim 9 wherein each respective shunt resistor capacitor termination is configured to reduce conversion loss of the mixer due to a self resonance of an inductance of the respective micro-strip line coupled to the respective base and a capacitance of the respective base to which the shunt resistor capacitor is connected.

13. A mixer comprising:
a bipolar junction transistor having an emitter, a collector, and a base;
an input port coupled to a first end of a first micro-strip line, wherein a second end of the first micro-strip line is connected to either the emitter or to the collector of the bipolar junction transistor;
an output port coupled to a first end of a second micro-strip line, wherein a second end of the second micro-strip line is connected to the collector of the bipolar junction transistor if the input port is coupled to the emitter by the first micro-strip line, or connected to the emitter of the bipolar junction transistor if the input port is coupled to the collector by the first micro-strip line;

a shunt resistor capacitor termination connected to the base;

a third micro-strip line, the third micro-strip line having a first end and a second end;

a local oscillator (LO) directly connected to the first end of the third micro-strip line; and the second end of the third micro-strip line connected to the base and connected to the shunt resistor capacitor termination;

wherein the LO has an LO frequency for mixing with a first frequency on the input port to produce a second frequency on the output port;

wherein the shunt resistor capacitor termination comprises a resistor in series with a capacitor; and wherein the shunt resistor capacitor termination is configured to reduce conversion loss of the mixer due to a self-resonance of a capacitance of the base and an inductance of the third micro-strip line.

14. The mixer of claim 13 wherein:
the input port is a radio frequency port; and
the output port is an intermediate frequency port.

15. The mixer of claim 13 wherein:
the input port is an intermediate frequency port; and
the output port is a radio frequency port.

16. The mixer of claim 13 wherein the shunt resistor capacitor termination comprises a resistor connected to the base and connected to a first terminal of a capacitor, and wherein a second terminal of the capacitor is connected to a ground.

17. The mixer of claim 13 wherein the mixer comprises a single balanced, double balanced or triple balanced resistive mixer.

18. A double balanced mixer comprising:
first, second, third and fourth bipolar junction transistors, each having a emitter, a collector and a base;
an input port having a positive and a negative polarity, the positive polarity of the input port coupled to either the emitter of the first and second bipolar junction transistors or to the collector of the first and second bipolar junction transistors, and the negative polarity of the input port coupled to either the emitter of the third and fourth bipolar junction transistors or to the collector of the third and fourth bipolar junction transistors;

an output port having a positive and a negative polarity, the positive polarity of the output port coupled to the collector of the first and third bipolar junction transistors if the positive polarity of the input port is coupled to the emitter of the first bipolar junction transistor and the negative polarity of the input port is coupled to the emitter of the third bipolar junction transistor, or the positive polarity of the output port coupled to the emitter of the first and third bipolar junction transistor if the positive polarity of the input port is coupled to the collector of the first bipolar junction transistor and the negative polarity of the input port is coupled to the collector of the third bipolar junction transistor, and the negative polarity of the output port coupled to the collector of the second and fourth bipolar junction transistors if the positive polarity of the input port is coupled to the emitter of the second bipolar junction transistor and the negative polarity of the input port is coupled to the emitter of the fourth bipolar junction transistor, or the negative polarity of the output port is coupled to the emitter of the second and fourth bipolar junction transistors if the positive polarity of the input port is coupled to the collector of the second bipolar junction transistor and the negative polarity of the input port is coupled to the collector of the fourth bipolar junction transistor;

a local oscillator for mixing a first frequency on the input port to a second frequency on the output port, the local oscillator having a positive and a negative polarity;

a first micro-strip line coupled to the base of the first bipolar junction transistor;

a second micro-strip line coupled to the base of the fourth bipolar junction transistor and coupled at a first junction to the first micro-strip line;

a third micro-strip line coupled to the base of the second bipolar junction transistor;

a fourth micro-strip line coupled to the base of the third bipolar junction transistor and coupled at a second junction to the third micro-strip line;

the positive polarity of the local oscillator connected to a first end of a fifth micro-strip line, a second end of the fifth micro-strip line connected to the second junction, and the negative polarity of the local oscillator connected to a first end of a sixth micro-strip line, a second end of the sixth micro-strip line connected to the first junction; and first, second, third and fourth shunt resistor capacitor terminations connected, respectively, to the bases of the first, second, third and fourth bipolar junction transistor;

wherein each shunt resistor capacitor termination comprises a resistor in series with a capacitor connected to a ground; and wherein the shunt resistor capacitor termination shifts a self-resonance frequency of the base to a lower out of band frequency to provide a broader band frequency mixer.

19. The mixer of claim 18 wherein:
the input port is a radio frequency port; and
the output port is an intermediate frequency port.

20. The mixer of claim 18 wherein:
the input port is an intermediate frequency port; and
the output port is a radio frequency port.

21. The mixer of claim 18 wherein each shunt resistor capacitor termination comprises a resistor connected to the respective base and connected to a first terminal of a capacitor, and wherein a second terminal of the capacitor is connected to a ground.

22. The mixer of claim 21 wherein each respective shunt resistor capacitor termination is configured to reduce conversion loss of the mixer due to a self resonance of an inductance of the respective micro-strip line coupled to the respective gate and a capacitance of the respective gate to which the shunt resistor capacitor is connected.

* * * * *